United States Patent [19]
McClure

[11] Patent Number: 5,491,444
[45] Date of Patent: Feb. 13, 1996

[54] FUSE CIRCUIT WITH FEEDBACK DISCONNECT

[75] Inventor: David C. McClure, Carrollton, Tex.

[73] Assignee: SGS-THOMSON Microelectronics, Inc., Carrollton, Tex.

[21] Appl. No.: 174,139

[22] Filed: Dec. 28, 1993

[51] Int. Cl.$^6$ .................................................. H01H 37/76
[52] U.S. Cl. ........................... 327/525; 326/50; 327/203
[58] Field of Search .............................. 365/225.7, 154; 307/202.1, 451, 272.2, 469, 443; 327/525, 202–203, 208; 326/49–50, 121, 83, 86, 21

[56] References Cited

U.S. PATENT DOCUMENTS

| | | | |
|---|---|---|---|
| 4,791,319 | 12/1988 | Tagami et al. | 307/202.1 |
| 4,829,481 | 5/1989 | Johnson et al. | 307/451 |
| 4,959,564 | 9/1990 | Steele | 307/202.1 |
| 4,995,004 | 2/1991 | Lee | 365/189.11 |
| 5,124,584 | 6/1992 | McClure | 307/480 |
| 5,124,587 | 6/1992 | Pribyl | 307/202.1 |
| 5,257,229 | 10/1993 | McClure et al. | 365/200 |
| 5,262,994 | 11/1993 | McClure | 365/200 |
| 5,265,054 | 11/1993 | McClure | 365/200 |
| 5,265,100 | 11/1993 | McClure et al. | 371/21.1 |
| 5,280,201 | 1/1994 | Fujimori et al. | 307/451 |

OTHER PUBLICATIONS

Hardee, et al., "A Fault–Tolerant 30 ns/375 mW 16K X 1 NMOS Static RAM", *IEEE J. of Solid–State Circuits*, V. SC–16, No, 5, Oct. 1981, pp. 435–443.

Childs, et al., "An 18 ns 4K×4 CMOS SCRAM" IEEE J. of Solid–State Circuits, V. SC–19, No. 5, Oct. 1984, pp. 545–551.

*Primary Examiner*—Edward P. Westin
*Assistant Examiner*—Jon Santamauro
*Attorney, Agent, or Firm*—Rodney M. Anderson; Lisa K. Jorgenson; Richard K. Robinson

[57] ABSTRACT

A method and circuit are disclosed which can be incorporated into any circuitry which uses fused algorithms to control the circuitry. Specifically, the invention may be incorporated into an integrated circuit device by way of a circuit that controls the coupling of an input signal to an output. Careful placement of a fuse or similarly functioning element in the circuit, permits the output of said circuit to be reliably set to a desired logic state. Specifically, when the fuse element is opened, a portion of the feedback path is disconnected, thereby preventing feedback in the direction of the unwanted logic state. The present invention enables construction of a fuse circuit which latches a desired logic state with stable performance and no layout area or speed degradation.

30 Claims, 2 Drawing Sheets

FUSE CIRCUIT WITH FEEDBACK DISCONNECT

BACKGROUND OF INVENTION

1. Field of the Invention

The present invention is in the field of integrated circuits, and is particularly directed to fuse circuits with feedback.

2. Description of the Prior Art

Many types of semiconductor memories are containing greater numbers of storage locations and higher capacity as manufacturing technology improves. For example, static random access memories (SRAMs) having $2^{20}$ storage locations (i.e., 1 Mbits) and dynamic random access memories (DRAMs) having $2^{22}$ storage locations (i.e., 4 Mbits) are available in the market. Additional highdensity memories include FIFOs, dual-port memories, and read-only memories of various types, fabricated as individual components and embedded in other integrated circuits such as microprocessors and other logic devices. These high-density memories, however, are usable only if each and every storage location or "bit" can be accessed and store both digital data states. Failure of a single storage location, or bit, may cause the entire memory (and logic device having an embedded memory) to be non-marketable, thereby increasing manufacturing costs and decreasing yields.

As a result, many semiconductor memories are now fabricated with redundant rows or columns which, when enabled, replace an entire row or column in the primary memory array. For example, a chip may contain two redundant rows for each subarray which may be substituted for defective rows. In this case, only chips with three or more defective rows in a subarray will be discarded. Examples of memory devices incorporating conventional redundancy schemes are described in Hardee, et al., "A Fault-Tolerant 30 ns/375 mW 16K×1 NMOS Static RAM", *J. Solid State Circuits*, Vol. SC-16, No. 5 (IEEE, 1981), pp. 435–43, and in Childs, et al., "An 18 ns 4K×4 CMOS SRAM", *J. Solid State Circuits*, Vol. SC-19, No. 5 (IEEE, 1984), pp. 545–51.

The enabling of redundant architecture is conventionally done during the manufacturing test process, where the primary memory is tested for functionality of the bits. The addresses of failing bits are logged, and an algorithm in the automated test equipment determines if the redundant rows or columns available on the circuit are sufficient to replace all of the failing bits. If so, fuses are opened (or, alternatively, anti-fuses may be closed) in the decoding circuitry of the memory so that the failing row or column is no longer enabled by its associated address value. Instead, access is made to the spare row or column upon receipt of the address for the defective row or column in the primary memory array. Conventional fuses include polysilicon fuses which can be opened by a laser beam, and also avalanche-type fuses and antifuses.

Conventional fuse circuitry, however, has not been entirely satisfactory when used in integrated circuit devices. Fuse circuitry frequently requires a latching function right at the fuse location. Due to the latching and resultant feedback path, the state of the circuitry near the fuse can be indeterminate when the fuse is blown. Indeterminate states within integrated circuits can result in parts which are unreliable or unstable. For example, this problem arose in the design of the fast cache SRAM memory device. The use of conventional fuse circuitry to disable defective rows or columns could not reliably maintain the output at the proper logic level. The problem was attributed to the circuitry feedback.

Therefore, it would be desirable to have a method and circuit for reliably setting the output of the circuit to a desired logic state, thereby preventing the feedback path from adversely affecting the output.

SUMMARY OF THE INVENTION

According to the present invention, a method and circuit are provided wherein the state of the circuitry past an opened fuse is reliably set to the desired logic state.

It is therefore an object of the present invention to provide a method for decoupling a portion of the feedback path of a fuse circuit maintaining a set logic state, so that the feedback path cannot latch in the unwanted logic state.

It is a further object of the present invention to provide such a circuit in which there is stable performance and no layout area or speed degradation.

It is a further object of the present invention to provide such a method and circuit for decoupling a portion of a feedback path so that the circuit's output is reliably set to a desired logic state.

The invention may be applied to any circuitry which uses fused algorithms to control circuitry. The invention may be incorporated into an integrated circuit device by way of a circuit that controls the coupling of an input signal to an output. Careful placement of a fuse or similarly functioning programmable element in the circuit, permits the output of said circuit to be reliably set to a desired logic state. Specifically, when the fuse element is opened, a portion of the feedback path is disconnected, thereby preventing feedback in the direction of the unwanted logic state.

Other objects and advantages of the present invention will be apparent to those of ordinary skill in the art having reference to the following specification together with the drawings.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

Figure 1:
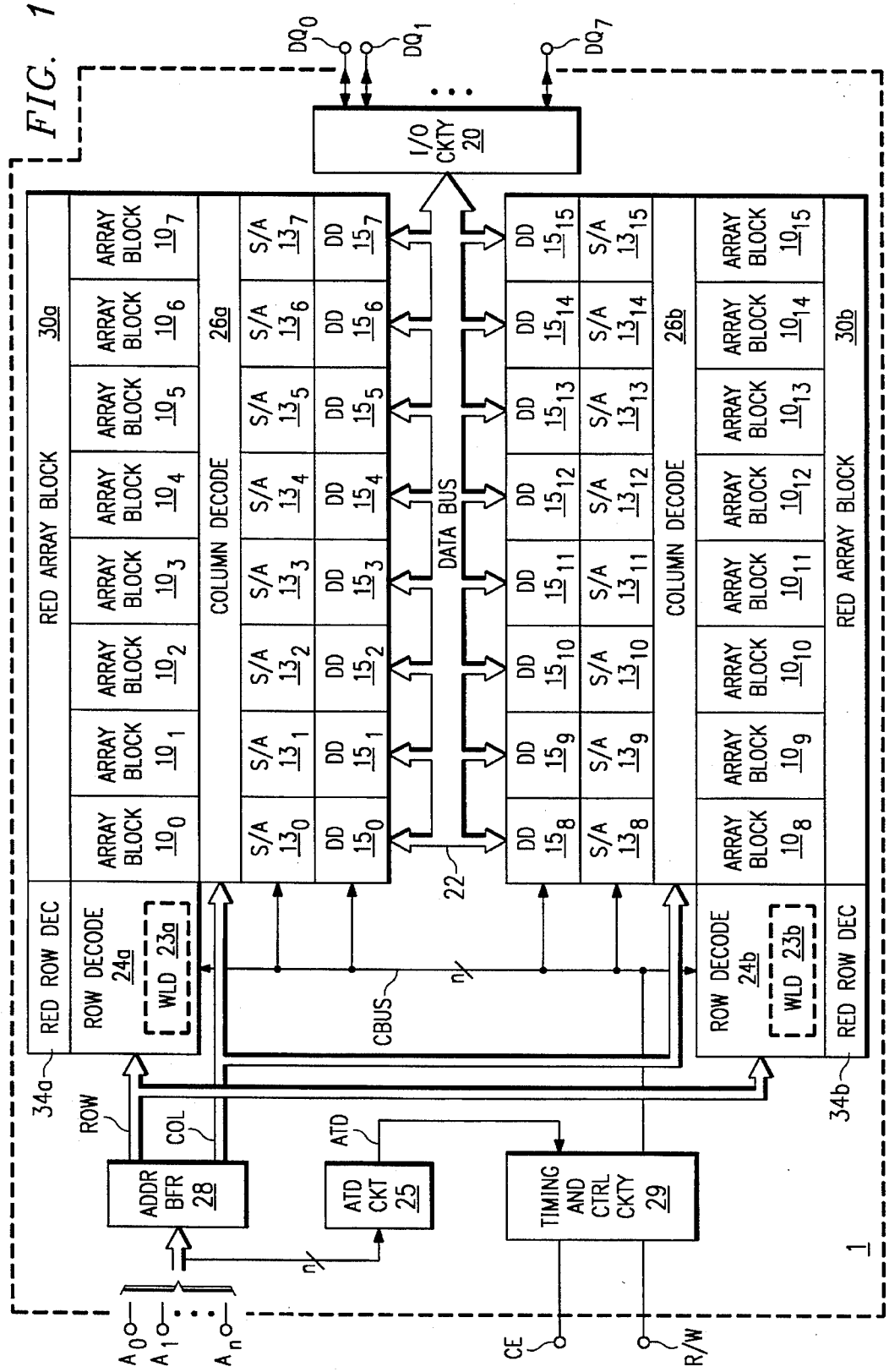
FIG. 1 is an electrical diagram, in block form, of a memory incorporating a preferred embodiment of the invention.

Referring to FIG. 1, an example of an integrated circuit into which a preferred embodiment of the invention is implemented will be described. In this example, memory 1 is a static random access memory (SRAM) of otherwise conventional architecture, having its memory cells in multiple blocks 10 which are shown, in FIG. 1, according to an example of their physical location. It is contemplated that integrated circuits of other types having memory arrays including redundancy architecture may also benefit from the present invention. Such integrated circuits include read-only memories, FIFOs, DRAMs and the like, as well as microprocessors and other logic devices having embedded memories.

Memory cells are conventionally arranged in rows and columns. In this example, memory 1 is a 128 k-by-8 1 Mbit SRAM, and includes 1024 columns for each of 1024 rows. As will be understood by those skilled in the art, the present invention is applicable to other row-by-column organizations; such layouts being dictated according to design and performance needs such as memory density and functionality.

The designation of rows and columns in memory 1, uses the term row to refer to the array direction in which a plurality of memory cells are selected by way of a word line. In conventional memories, each of the memory cells in the selected row are generally coupled to one or a complementary pair of bit lines. The term column is used to refer to the array direction in which one or more of the memory cells in the selected row are selected for read or write access. In conventional memories, this is generally accomplished by coupling one of the bit lines to a sense amplifier/write circuit, or to an internal data bus. It is contemplated that such use of the terms rows and columns is consistent with the general understanding in the art.

In memory 1, address terminals $A_0$ through $A_n$ receive an address signal according to which the memory cells to be accessed are designated. Address terminals $A_0$ through $A_n$ are connected to address buffers 28, which buffer the received address signal and communicate a portion of the address signal to row decoders 24a, 24b on bus ROW, and communicate the remainder to column decoders 26a, 26b on bus COL. Row decoders 24a, 24b select a row of memory cells by enabling the selected word line in the conventional manner. In a like manner, redundant row decoders 34a, 34b, select a row of cells from redundant array block 30a, 30b, when an address signal is diverted from a deselected primary row. Column decoders 26a, 26b, in this example, select eight memory cells in the selected row to be sensed by a sense amplifier 13 according to the column portion of the address.

It should also be noted that other physical and electrical arrangements of subarrays 10 and redundant array 30 may alternatively be used with the present invention. For example, row decoder or decoders 24 may be positioned in the center of subarrays 10 rather than along one edge as shown in FIG. 1. It is contemplated that the particular layout of memory 1 will be determined by one of ordinary skill in the art according to the particular parameters of interest for the specific memory design and manufacturing processes.

According to this example, the memory cells are grouped into sixteen primary array blocks $10_0$ through $10_{15}$. The number of array blocks 10 may vary from implementation to implementation, according to the desired functionality of memory 1. Selection of a row within one of primary array blocks 10 may be made by way of a global word line generated by row decoders 24a, 24b, extending across those primary array blocks 10 for which it is operable. Pass gates by which memory cells within each of primary array blocks 10 are connected to their bit lines are controlled by local word lines which extend only within each primary array block 10 for each row portion therein. Pass transistors connected between each global word line and the local word lines are enabled according to a block portion of the column address, so that only the local word line associated with the primary array block 10 selected by the column address is enabled.

Alternatively, selection of the block may be done according to one of the row address bits (indicating upper or lower half) and to four of the column address bits (indicating one of sixteen primary array blocks 10 to be selected). An additional memory configuration into which the present invention may be incorporated is described in U.S. Pat. No. 5,265,100, issued Nov. 23, 1993, assigned to SGS-Thomson Microelectronics, Inc., and incorporated herein by this reference.

Memory 1, as in the case of most modern SRAMs and DRAMs, includes some amount of dynamic operation, such as precharging and equilibration of certain nodes (e.g., bit lines) at particular points in the memory cycle. Initiation of the cycle in SRAM 1 occurs by way of address transition detection, performed by address transition detection (ATD) circuit 25. ATD circuit 25 is connected to each of the address inputs $A_0$ through $A_n$, preferably prior to address buffers 28 (as shown), and generates a pulse on line ATD responsive to detecting a transition at any one or more of address inputs $A_0$ through $A_n$, such a pulse useful in controlling the internal operation of memory 1 in the conventional manner. A preferred example of ATD circuit 25 and address buffers 28 is described in U.S. Pat. No. 5,124,584, issued Jun. 23, 1992, assigned to SGS-Thomson Microelectronics, Inc. and incorporated herein by this reference.

Other internal operational functions are controlled by timing and control circuitry 29, which receives the signal on line ATD from ATD circuit 25, and which also receives certain external control signals such as the chip enable signal at terminal CE, and the read/write select signal at terminal R/W. Timing and control circuitry 29 generates various control signals based on these inputs, for control of the various functions within memory 1 in the conventional manner. As shown in FIG. 1, control bus CBUS is connected to sense amplifiers 13 and data drivers 15; other functions are similarly controlled by timing and control circuitry 29 in the conventional manner, with their connections not shown in FIG. 1 for purposes of clarity.

Each of primary array blocks $10_0$ through $10_{15}$ is associated with a corresponding group of sense amplifiers $13_0$ through $13_{15}$, as shown in FIG. 1. Groups of data drivers $15_0$ through $15_{15}$ are each associated with a corresponding group of sense amplifiers $13_0$ through $13_{15}$ for receiving the data signal therefrom and for driving internal data bus 22 therewith. In this example, the memory array is also divided into halves, with primary array blocks $10_0$ through $10_7$ in one array half and primary array blocks $10_8$ through $10_{15}$ in the other half. Internal data bus 22 runs the length of the array halves, and is located therebetween as shown in FIG. 1. Data bus 22 includes eight data conductors, each associated with an input/output terminal $DQ_0$ through $DQ_7$ and coupled thereto via input/output circuitry 20.

Further detail regarding the general construction and operation of circuits incorporating redundant architecture can be found in U.S. Pat. No. 5,257,229, issued Oct. 26, 1993; U.S. Pat. No. 5,262,994, issued Nov. 16, 1993; and U.S. Pat. No. 5,265,054, issued Nov. 23, 1993; each of which are assigned to SGS-Thomson Microelectronics, Inc., and incorporated herein by this reference.

Figure 2:
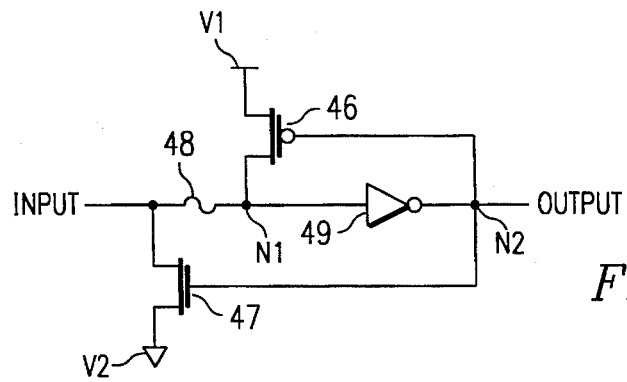
FIG. 2 is an electrical diagram, in schematic form, of a preferred embodiment of the invention.

Referring now to FIG. 2, a fuse circuit incorporating a preferred embodiment of the invention will be described without reference to, or limitation by, semiconductor memories. The circuit disclosed in FIG. 2 is a latching circuit consisting of two switching elements 46, 47, a fuse element 48, and a logic element 49. Specifically, logic element 49 can be any one or plurality of logic elements such as inverters, NOR gates or NAND gates. It will be understood by one skilled in art that different types and numbers of conventional logic elements may be substituted for the logic element shown in FIG. 2. Such logic elements will be chosen according to the design and performance specifications of the device incorporating the present invention.

Under normal operation with fuse element 48 intact, the circuit of FIG. 2 provides full latching capability. Responsive to an input, the circuit can maintain one of two states at nodes N1, N2 during normal operation. For example, node N2 can be maintained high or low by the feedback path as shown in FIG. 2. When the fuse element is opened, however, a portion of the feedback path is separated as more fully set forth hereinbelow. The remaining portion of the feedback path is now separated from the input signal and latches in only one state.

As shown in FIG. 2, transistor 46 has its source to drain path coupled between a first voltage source V1 and the input of inverter 49. Fuse element 48 has a first terminal connected to the input of inverter 49 and a second terminal connected to transistor 47 and an input source. The source to drain path of transistor 47 is coupled between the input signal and a second voltage source V2. Furthermore, the output of inverter 49 is connected to and controls the gates of transistors 46, 47. With fuse element 48 intact, the source to drain paths of transistors 46, 47 are connected in series between the first and second voltage sources.

Fuse element 48 can be any selectable component or device which, when opened or programmed, breaks the series connection between transistors 46, 47 from the first voltage source V1 to the second voltage source V2. In this embodiment, the fuse element is preferably a polysilicon fuse. It may also be an antifuse or other similar device. In this example, transistors 46, 47, are complimentary MOS transistors. Transistor 46 is a p-channel transistor and transistor 47 is an n-channel transistor. The values (W/L) of transistors 46, 47 are chosen such that the input signal can overcome these transistors to define the state on node N1. It will be understood and appreciated by one skilled in the art that transistors 46, 47 may be bipolar transistors or any other switching element. In addition, the number of transistors or switching elements placed in the series path between voltage sources V1, V2 will be dictated by the specific design and performance characteristics of the device incorporating the present invention.

As shown in FIG. 2, the first voltage source V1 is high, Vcc, and the second voltage source V2 is low, Vss or ground. Presentation of a logic state at node N1 causes an inverted logic state to be output at node N2. If the inverted value at node N2 is low, transistor 46 acts to pull node N1 toward Vcc thereby maintaining node N2 in a low logic state. Conversely, if the inverted value at node N2 is high, transistor 47 pulls node N1 low, toward Vss, when fuse element 48 is intact. When fuse 48 is opened, however, the path to Vss is separated from node N1 and no longer affects the feedback path. The path from Vcc through transistor 46 to node N1 remains intact. This allows the value at node N2 to reliably remain set low since the n-channel transistors can no longer pull node N1 toward a lower voltage, causing the value at the nodes to oscillate or change state. The state of node N1 is now only affected by either conduction of transistor 46 or leakage current at the drain of transistor 46 to vcc.

In an alternative embodiment, the placement of the transistors may be changed such that when fuse element 48 is opened, the path to the first voltage source V1 will be separated from the portion of the feedback path left intact. Specifically, the source to drain path of transistor 47 will be coupled between the input of logic element 49 and the second voltage source V2, whereas the source to drain path of transistor 46 will be coupled between the second terminal of fuse element 48 and the first voltage source V1.

It will be understood and appreciated by one skilled in the art that the present invention can be incorporated into any circuitry utilizing fused algorithms to control the circuit. For example, the present invention may be used to form a decoding element within a device. The decoding element may include a row decoder, a column decoder or both. Such a decoding element may be disabled through a redundancy implementor. A preferred embodiment of the invention, as incorporated in the memory system of FIG. 1 will now be set forth in detail. Such description is included to set forth an example of an application and use of the present invention and not by way of limitation.

Figure 3:
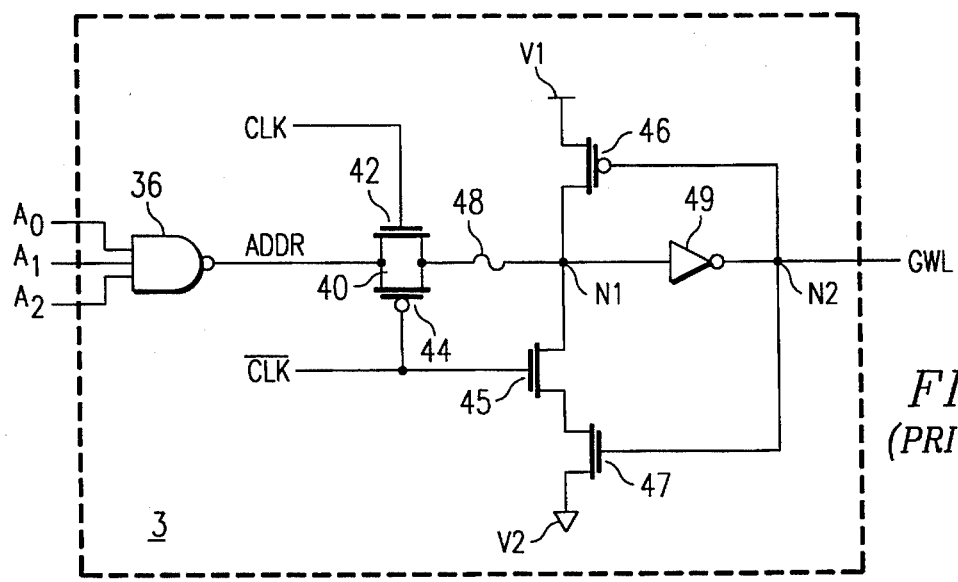
FIG. 3 is an electrical diagram, in schematic form, of a global word line select circuit.

Referring now to FIG. 3, the construction of a global wordline select circuit follows, without detailed reference to the address input circuitry 25 and 28 suggested in FIG. 1. Select circuit 3 is primarily a conventional latch circuit coupled between NAND gate 36 and global wordline GWL, commonly used in the communication of address signals to memory cells in integrated circuits. It should be noted that other latches, bistable multivibrators, or flip-flops of various types (e.g., R-S and J-K flip-flops, and single stage clocked latched) may alternatively be used in place of the latch circuitry shown in FIG. 3 and incorporate the features of the present invention as described herein below. In addition, one of ordinary skill in the art would recognize that NAND gate 36 may be replaced by a variety of other logic elements such as a NOR gate, NOT gate, or decoding element, depending upon the design and constraints employed by the memory system.

The output of NAND gate 36 is connected to the input of pass gate 42 via data input line ADDR. Pass gate 40 consists of complementary MOS transistors 42, 44, gated by complementary clock inputs CLK and CLK_. In this example pass gate 40 is formed by n-channel transistor 42 and p-channel transistor 44 connected in parallel between the output of NAND gate 36 and fuse element 48. In this example, pass gate 40 has one input at line ADDR and one output connected to fuse element 48. Fuse element 48, is preferably a conventional fuse, such as a polysilicon fuse. Of course, other types of fuses, as well as antifuses, may be used in the alternative to a polysilicon fuse.

Next, three transistors 45, 46, 47 and logic gate 49, follow fuse element 48. Specifically, p-channel transistor 46 has its source to drain path coupled in series between a power supply Vcc and two n-channel transistors 45, 47. N-channel transistors 45, 47 have their source to drain paths connected in series to power supply Vss. The input of inverter 49 is connected to transistors 45, 46 and fuse 48 at node N1, as shown. The output of inverter 49 controls the gates of transistors 46, 47 at node N2, as shown; whereas the gate of transistor 45 is controlled by CLK_.

A discussion of the operation of the circuit set forth in FIG. 3 with fuse element 48 intact will now be described. The output of NAND gate 36 presents signals on line ADDR which are communicated to global wordline GWL at node N2 as hereinafter described. Upon clock input CLK going high and CLK_ going low, transistors 42, 44 of pass gate 40 turn on and communicate the logic state from the output of NAND gate 36 through fuse element 48 to node N1 as shown. After CLK goes low, the logic level at node N2 is maintained until a new address signal is activated and a new input is presented to the circuit along line ADR. Upon clock input CLK going low and clock input CLK_ going high, pass gate 40 turns off and node N2 is latched by transistors 45, 46, 47.

In this circuit, where a high logic level is input to pass gate 40, a high level is presented to node N1 which is inverted by inverter 49 to a low logic state at node N2. Conversely, where a low logic level is input to pass gate 40, a low logic level is presented to N1 which is inverted by inverter 49 to a high logic state at node N2, thereby selecting the row associated with global word line GWL.

During the manufacturing stage, if a particular row is found to contain nonrepairable bits, fuse 48 on the corresponding local or global word line is opened. Fuse 48 is preferably opened by a laser, electrical overstress, or other conventional techniques. Opening fuse element 48 operates to disable defective GWL by preventing the presentation of address inputs from NAND gate 36 to node N1, and theoretically maintaining node N2 at a low logic level.

A problem arises during the normal operation of circuit 3, however, when fuse element 48 is blown to disable the word line GWL and place node N2 at a low logic state, The logic level at node N1 is indeterminate thereby affecting the logic state at node N2. After the fuse is blown the portion of the feedback path between transistors 45, 47 and Vss can act to pull node N1 low, depending upon power up conditions, noise, and process variations. This could happen because, transistor 46 can pull node N1 high to the desired logic level or transistors 45, 47 can pull node N1 low to the undesired logic state, or both. This feedback cycle may cause the logic state at nodes N1, N2 to either oscillate or be pulled high as opposed to maintaining the desired low level. This problem can be avoided, however, by implementation of the principles of the present invention.

Figure 4:
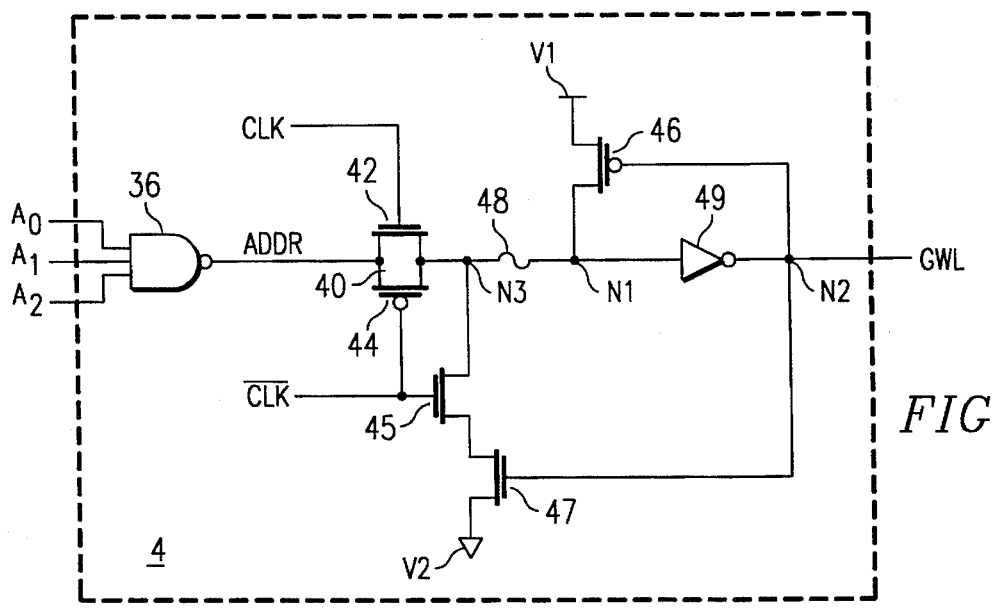
FIG. 4 is an electrical diagram, in schematic form, of a global wordline select circuit incorporating a preferred embodiment of the invention.

Referring to FIGS. 3 and 4, modification of global wordline select circuit 3 to that shown in FIG. 4 allows for the output path from NAND gate 36 along line ADDR to be isolated from node N1 when fuse element 48 is opened. This isolation during the deselection of global wordline GWL, permits node N2 to be reliably set to low, thereby terminating the undesired portion of the feedback loop without any device speed or performance degradation.

Referring now to FIG. 4, the source to drain path of transistors 45, 47 has been moved from node N1. The path is now coupled between node N3 and Vss in a similar fashion previously shown in FIG. 2. When Fuse element 48 is intact, the path from the output of NAND gate 36 to word line GWL operates identically to the path shown in FIG. 3. With the placement of fuse element 48 in the feedback path of transistors 45, 46, 47 and inverter 49, however, opening the fuse decouples the n-channel feedback path from the feedback path through node N1. This decoupling of the portion of the feedback path between node N1 and ground allow the value at node N2 to be reliably set low. Now, all that remains is the portion of the feedback path between transistor 46 and Vcc which act to pull the value at node N1 high toward Vcc without interference from the path between transistors 45, 47 and Vss.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A circuit for defining a logic state in an integrated circuit, comprising:

a first logic element having an input and an output;

a fuse element having a first terminal and a second terminal wherein the first terminal is coupled to the input of said first logic element, said fuse element being selectively configured in a conducting or a non-conducting state between said first and second terminals;

a first transistor having a control electrode and having a conduction path coupled between a first voltage source and the input of said first logic element, said conduction path of said first transistor being enabled or disabled responsive to the output of said first logic element; and a second transistor having a control electrode and having a conduction path coupled between the second terminal of said fuse element and a second voltage source such that said second voltage source is decoupled from said input of said first logic element if said fuse element is in said non-conductive state, said conduction path of said second transistor being enabled or disabled responsive to the output of said first logic element.

2. The circuit of claim 1 wherein said first logic element is a logic gate.

3. The circuit of claim 2 wherein said logic gate is an inverter.

4. The circuit of claim 1 wherein said first and second transistors are complementary transistors.

5. The circuit of claim 1 wherein said first transistor is a MOS transistor.

6. The circuit of claim 5 wherein said first transistor is a p-channel transistor.

7. The circuit of claim 1 wherein said second transistor is a MOS transistor.

8. The circuit of claim 7 wherein said second transistor is an n-channel transistor.

9. The circuit of claim 1 wherein said fuse element is a fuse.

10. The circuit of claim 9 wherein said fuse element is a polysilicon fuse.

11. The circuit of claim 1 further comprising a pass gate having an input and an output wherein said output is connected to the second terminal of said fuse element.

12. The circuit of claim 11 wherein said pass gate comprises a third transistor and a fourth transistor connected in parallel.

13. The circuit of claim 12 wherein said third and fourth transistors are complementary MOS transistors.

14. The circuit of claim 12 wherein said third transistor is an n-channel transistor.

15. The circuit of claim 12 wherein said fourth transistor is a p-channel transistor.

16. The circuit of claim 11 further comprising a fifth transistor having a conduction path placed in series with the conduction path of said second transistor between the second terminal of said fuse element and said second voltage source and having a control electrode connected to the control electrode of said fourth transistor of said pass gate.

17. The circuit of claim 16 wherein said fifth transistor is a MOS transistor.

18. The circuit of claim 17 wherein said fifth transistor is an n-channel transistor.

19. The circuit of claim 11 further comprising a second logic element having an input and an output wherein said output is connected to the input of said pass gate.

20. The circuit of claim 19 wherein said second logic element is a logic gate.

21. The circuit of claim 20 wherein said logic gate is a NAND gate.

22. The circuit of claim 19 wherein said second logic element is a decoding element.

23. The circuit of claim 22 wherein said decoding element is a row decoder.

24. A method for isolating a signal path, comprising the steps of:

buffering an output signal with a circuit;

selectively configuring a fuse element between an input terminal and an input to said circuit in an enabled or a disabled state;

connecting a first voltage, in response to the output signal, to the input of the circuit; and connecting a second voltage, in response to the output signal, to the input terminal, such that the input terminal is decoupled from the input of said circuit if said fuse element is in a disabled state and is coupled to the input of said circuit if said fuse element is in an enabled state.

25. The method of claim 24 wherein the step of selectively configuring a fuse element comprises the step of opening a fuse between said input terminal and the input to said circuit.

26. A circuit for isolating a signal path, comprising:

circuit means for buffering an output signal;

fuse means for selectively opening a connection between an input terminal and an input to said circuit means;

first transistor switch means for connecting a first voltage, in response to the output signal applied thereto, to the input of the circuit means; and second transistor switch means for connecting a second voltage, in response to the output signal applied thereto, to the input to said circuit means, said second voltage being decoupled from the input terminal if said fuse means is in an open state.

27. The circuit of claim 26 wherein said circuit means comprises a logic gate.

28. The circuit of claim 26 wherein said first and second transistor switch means comprise complementary MOS transistors.

29. The circuit of claim 28 wherein said first transistor is an n-channel transistor and said second transistor is a p-channel transistor.

30. A circuit for defining a logic state in an integrated circuit, comprising:

a first logic element having an input and an output;

a fuse element having a first terminal and a second terminal wherein the first terminal is coupled to the input of said first logic element, said fuse element being selectively configured in a conducting or a non-conducting state between said first and second terminals;

circuitry for receiving a logic signal at said first terminal;

a first transistor having a control electrode and having a conduction path coupled between a first voltage source and the input of said first logic element, said conduction path of said first transistor being enabled or disabled responsive to the output of said first logic element; and a second transistor having a control electrode and having a conduction path coupled between the second terminal of said fuse element and a second voltage source such that said second voltage source is decoupled from said input of said first logic element if said fuse element is in said non-conductive state, said conduction path of said second transistor being enabled or disabled responsive to the output of said first logic element.

* * * * *